United States Patent
Yoshikawa et al.

(10) Patent No.: US 12,334,265 B2
(45) Date of Patent: Jun. 17, 2025

(54) ELECTRONIC COMPONENT HAVING THE DIELECTRIC FILM NOT COVERS A CORNER PART OF THE LOWER ELECTRODE

(71) Applicant: TDK Corporation, Tokyo (JP)

(72) Inventors: Kazuhiro Yoshikawa, Tokyo (JP); Kenichi Yoshida, Tokyo (JP); Takashi Ohtsuka, Tokyo (JP)

(73) Assignee: TDK Corporation, Tokyo (JP)

( * ) Notice: Subject to any disclaimer, the term of this patent is extended or adjusted under 35 U.S.C. 154(b) by 483 days.

(21) Appl. No.: 17/784,857

(22) PCT Filed: Dec. 4, 2020

(86) PCT No.: PCT/JP2020/045209
§ 371 (c)(1),
(2) Date: Jun. 13, 2022

(87) PCT Pub. No.: WO2021/124926
PCT Pub. Date: Jun. 24, 2021

(65) Prior Publication Data
US 2023/0005667 A1 Jan. 5, 2023

(30) Foreign Application Priority Data
Dec. 19, 2019 (JP) .................................. 2019-229654

(51) Int. Cl.
*H01G 4/30* (2006.01)
*H01G 4/08* (2006.01)
(Continued)

(52) U.S. Cl.
CPC .............. *H01G 4/224* (2013.01); *H01G 4/08* (2013.01); *H01G 4/30* (2013.01); *H01G 4/40* (2013.01)

(58) Field of Classification Search
CPC .. H01G 4/08; H01G 4/30; H01G 4/33; H01G 4/40; H01F 17/00
(Continued)

(56) References Cited

U.S. PATENT DOCUMENTS

2007/0109719 A1 5/2007 Kuwajima et al.
2008/0023219 A1 1/2008 Yoshizawa et al.
(Continued)

FOREIGN PATENT DOCUMENTS

JP 06-045188 A 2/1994
JP 2002-260956 A 9/2002
(Continued)

OTHER PUBLICATIONS

International Search Report issued in corresponding International Patent Application No. PCT/JP2020/045209, dated Feb. 16, 2021, with English translation.

*Primary Examiner* — Hoai V Pham
(74) *Attorney, Agent, or Firm* — Rimon P.C.

(57) ABSTRACT

An electronic component includes: a conductive pattern provided on the main surface of a substrate and constituting a lower electrode; a dielectric film that covers top and side surfaces of the conductive pattern; and a conductive pattern stacked on the top surface of the conductive pattern through the dielectric film and constituting an upper electrode. A part of the dielectric film that is parallel to the main surface of the substrate is removed at least partly. Partially removing a part of the dielectric film that is parallel to the main surface of the substrate allows stress relaxation. This prevents peeling at the interface between the lower electrode and the dielectric film.

11 Claims, 21 Drawing Sheets

(51) Int. Cl.
*H01G 4/224* (2006.01)
*H01G 4/40* (2006.01)

(58) Field of Classification Search
USPC .......................................................... 257/303
See application file for complete search history.

(56) References Cited

U.S. PATENT DOCUMENTS

2009/0166074 A1* 7/2009 Furuya ................... H01G 4/228
174/260
2011/0042127 A1* 2/2011 Ohtsuka ................. H10D 1/692
427/97.1

FOREIGN PATENT DOCUMENTS

| JP | 2006-228907 A | 8/2006 |
| JP | 2007-142109 A | 6/2007 |
| JP | 2008-034626 A | 2/2008 |
| JP | 2018-101784 A | 6/2018 |

* cited by examiner

ELECTRONIC COMPONENT HAVING THE DIELECTRIC FILM NOT COVERS A CORNER PART OF THE LOWER ELECTRODE

CROSS REFERENCE TO RELATED APPLICATIONS

This application is the U.S. National Phase under 35 U.S.C. § 371 of International Application No. PCT/JP2020/045209, filed on Dec. 4, 2020, which claims the benefit of Japanese Patent Application No. 2019-229654, filed on Dec. 19, 2019, the entire contents of each are hereby incorporated by reference.

TECHNICAL FIELD

The present invention relates to an electronic component and its manufacturing method and, more particularly, to an electronic component having a capacitor and its manufacturing method.

BACKGROUND ART

Patent Documents 1 and 2 disclose an electronic component having a capacitor and an inductor formed on a substrate. The capacitor described in Patent Documents 1 and 2 includes a lower electrode, a dielectric film covering the lower electrode, and an upper electrode that faces the lower electrode through the dielectric film. In electronic components of such a type, a good conductor such as copper is used for the material of the upper and lower electrodes, and an inorganic insulating material such as silicon nitride is used for the dielectric film.

CITATION LIST

Patent Document

[Patent Document 1] JP 2007-142109A
[Patent Document 2] JP 2008-034626A

SUMMARY OF THE INVENTION

Problem to be Solved by the Invention

However, an inorganic insulating material such as silicon nitride has high stress, so that when it is formed over the entire surface of a substrate, peeling may occur due to stress. Such peeling is most conspicuous at the corner portion which is the terminal edge between the top and side surfaces of a lower electrode and may propagate from the corner portion. The peeling of the dielectric film not only deteriorates reliability of a product but also may make a capacitance deviate from a designed value. Such a problem occurs not only for the inorganic insulating material but also for materials having high stress.

It is therefore an object of the present invention to provide an electronic component having a capacitor and capable of preventing peeling at the interface between the lower electrode and the dielectric film by relaxing the stress of the dielectric film.

Means for Solving the Problem

An electronic component according to the present invention includes: a lower electrode provided on the main surface of a substrate; a dielectric film that covers at least the top and side surfaces of the lower electrode; and an upper electrode stacked on the top surface of the lower electrode through the dielectric film, wherein a part of the dielectric film that is parallel to the main surface of the substrate is removed at least partly.

According to the present invention, a part of the dielectric film that is parallel to the main surface of the substrate is removed at least partly, so that stress is relaxed due to the removal of the dielectric film. This can prevent peeling at the interface between the lower electrode and the dielectric film.

In the present invention, a part of the dielectric film that covers the corner part that is a terminal edge between the top and side surfaces of the lower electrode may be removed at least partly. This can prevent peeling at the corner part on which stress is likely to concentrate.

In the present invention, the dielectric film may include a first part that covers the top surface of the lower electrode not through the upper electrode, and the first part may be removed at least partly. This can effectively prevent peeling at the interface between the upper surface of the lower electrode and the dielectric film.

In the present invention, the dielectric film may include a second part that covers the main surface of the substrate not through the lower electrode, and the second part may be removed at least partly. The second part of the dielectric film has a large area, so that by removing the second part at least partly, stress can be effectively relaxed.

The electronic component according to the present invention may further include a passivation film that covers the upper electrode in a region where the upper electrode is present and covers the dielectric film in a region where the upper electrode is absent, and a part of a laminated film of the dielectric film and passivation film that is parallel to the main surface of the substrate may be removed at least partly. The laminated film of the dielectric film and passivation film has higher stress, so that by removing at least partly a part of the laminated film that is parallel to the main surface of the substrate, stress can be relaxed. In this case, the dielectric film and passivation film may be both made of an inorganic insulating material. When both the dielectric film and passivation film are made of an inorganic material, the laminated film has higher stress; however, even in this case, peeling can be prevented due to stress relaxation.

The electronic component according to the present invention may further include an inductor pattern positioned in the same conductive layer as the lower electrode, and a part of the dielectric film positioned on the top surface of the inductor pattern may be removed at least partly. This can provide an LC filter having high reliability.

An electronic component manufacturing method according to the present invention includes the steps of: forming a lower electrode on the main surface of a substrate; forming a dielectric film on the main surface of the substrate and the top and side surfaces of the lower electrode; forming a upper electrode that faces the top surface of the lower electrode through the dielectric film; and removing at least partly a part of the dielectric film that is positioned on the main surface of the substrate or on the top surface of the lower electrode.

According to the present invention, a part of the dielectric film that is positioned on the main surface of the substrate or on the top surface of the lower electrode is removed at least partly, so that stress of the dielectric film is relaxed. This can prevent peeling at the interface between the lower electrode and the dielectric film.

The electronic component manufacturing method according to the present invention may further include a step of forming a passivation film that covers the upper electrode and dielectric film, and the removal step may be performed by removing at least partly a part of a laminated film of the dielectric film and passivation film that is positioned on the main surface of the substrate or on the top surface of the lower electrode. This can relax the stress of the laminated film having higher stress.

Advantageous Effects of the Invention

As described above, according to the present invention, in an electronic component having a capacitor, the stress of the dielectric film is relaxed, so that it is possible to prevent peeling at the interface between the lower electrode and the dielectric film.

MODE FOR CARRYING OUT THE INVENTION

Hereinafter, preferred embodiments of the present invention will be described in detail with reference to the accompanying drawings.

Figure 1:
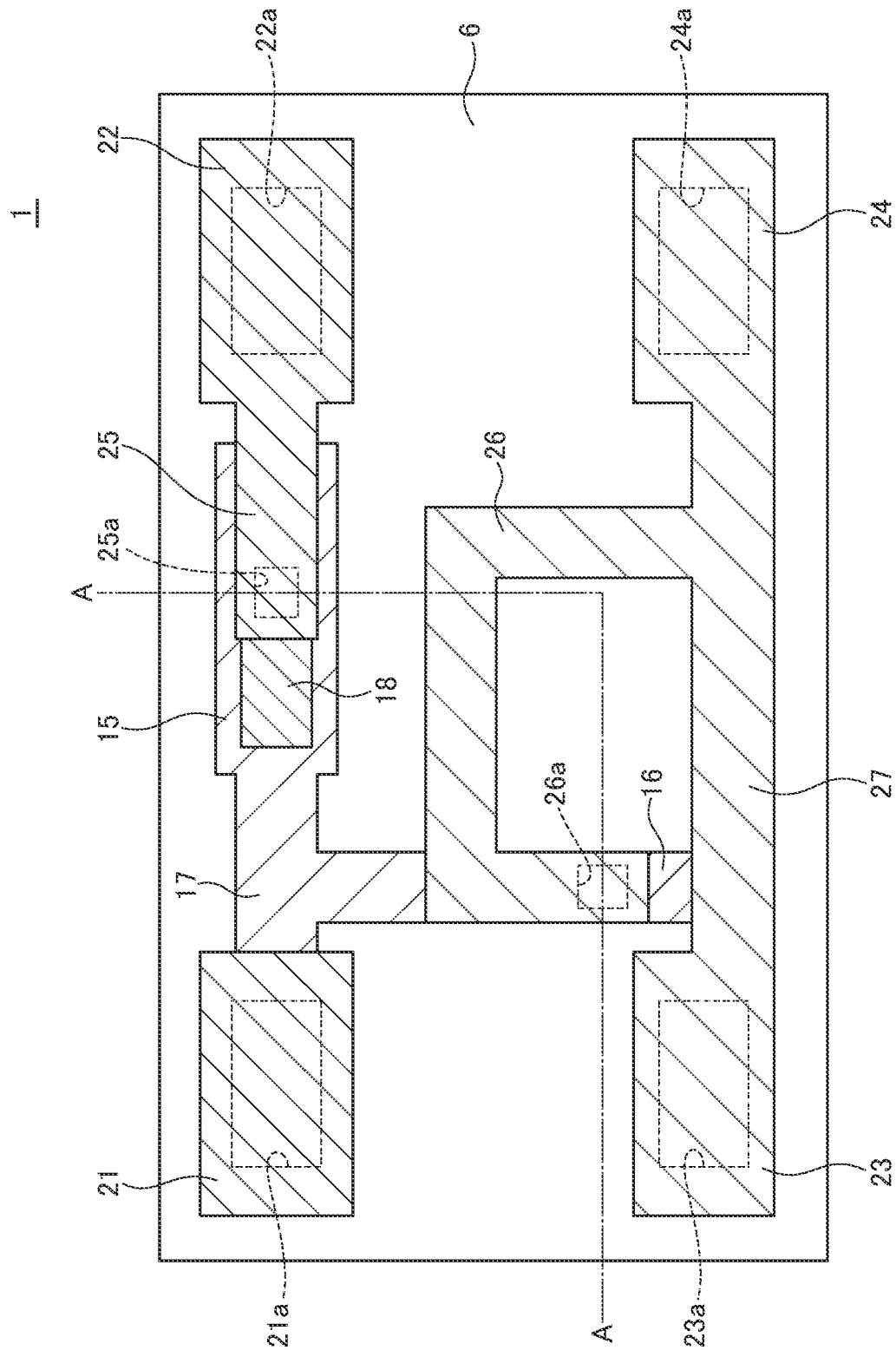
FIG. 1 is a schematic plan view for explaining the structure of an electronic component 1 according to an embodiment of the present invention.
Figure 2:
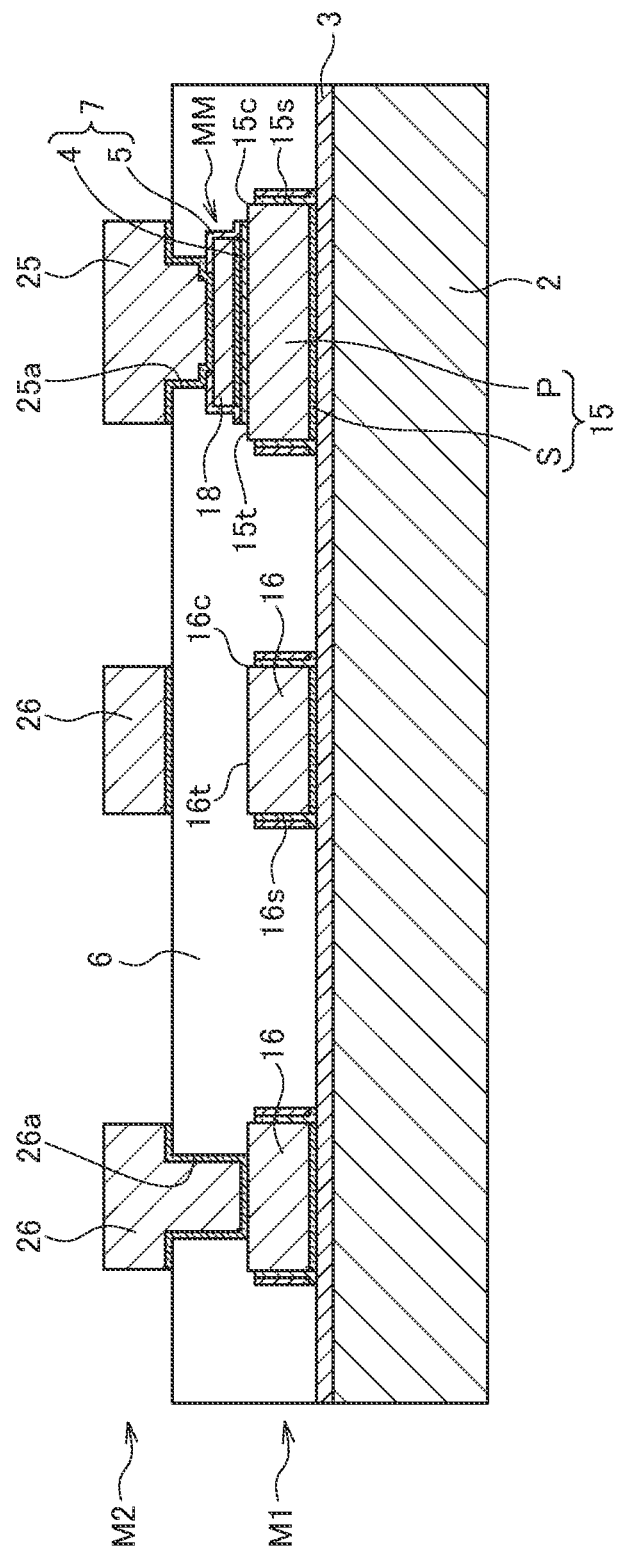
FIG. 2 is a schematic cross-sectional view taken along the line A-A in FIG. 1.

FIG. 1 is a schematic plan view for explaining the structure of an electronic component 1 according to an embodiment of the present invention. FIG. 2 is a schematic cross-sectional view taken along the line A-A in FIG. 1.

Figure 3:
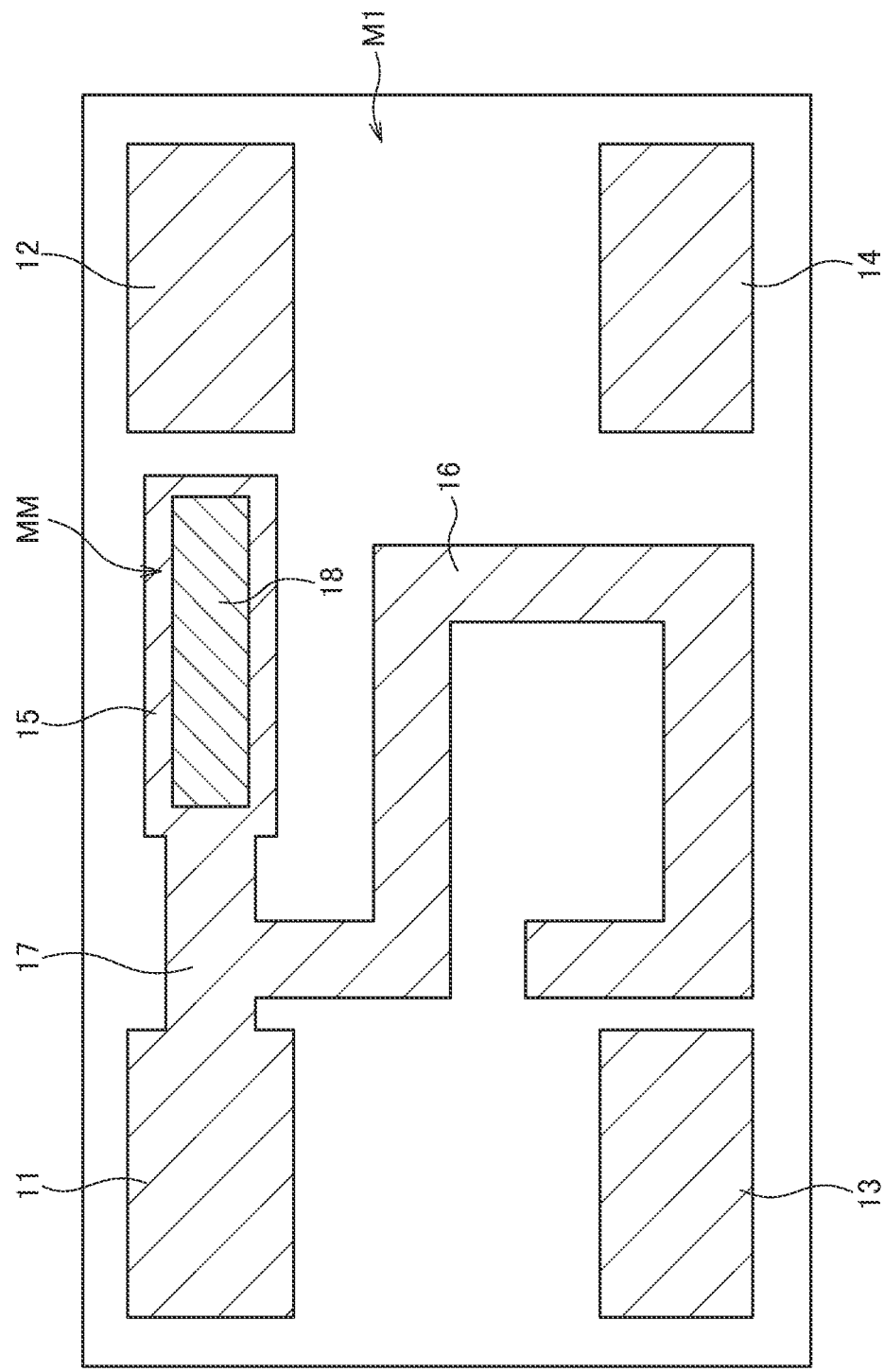
FIG. 3 is a schematic plan view for explaining the pattern shape of the conductive layers M1 and MM.
Figure 4:
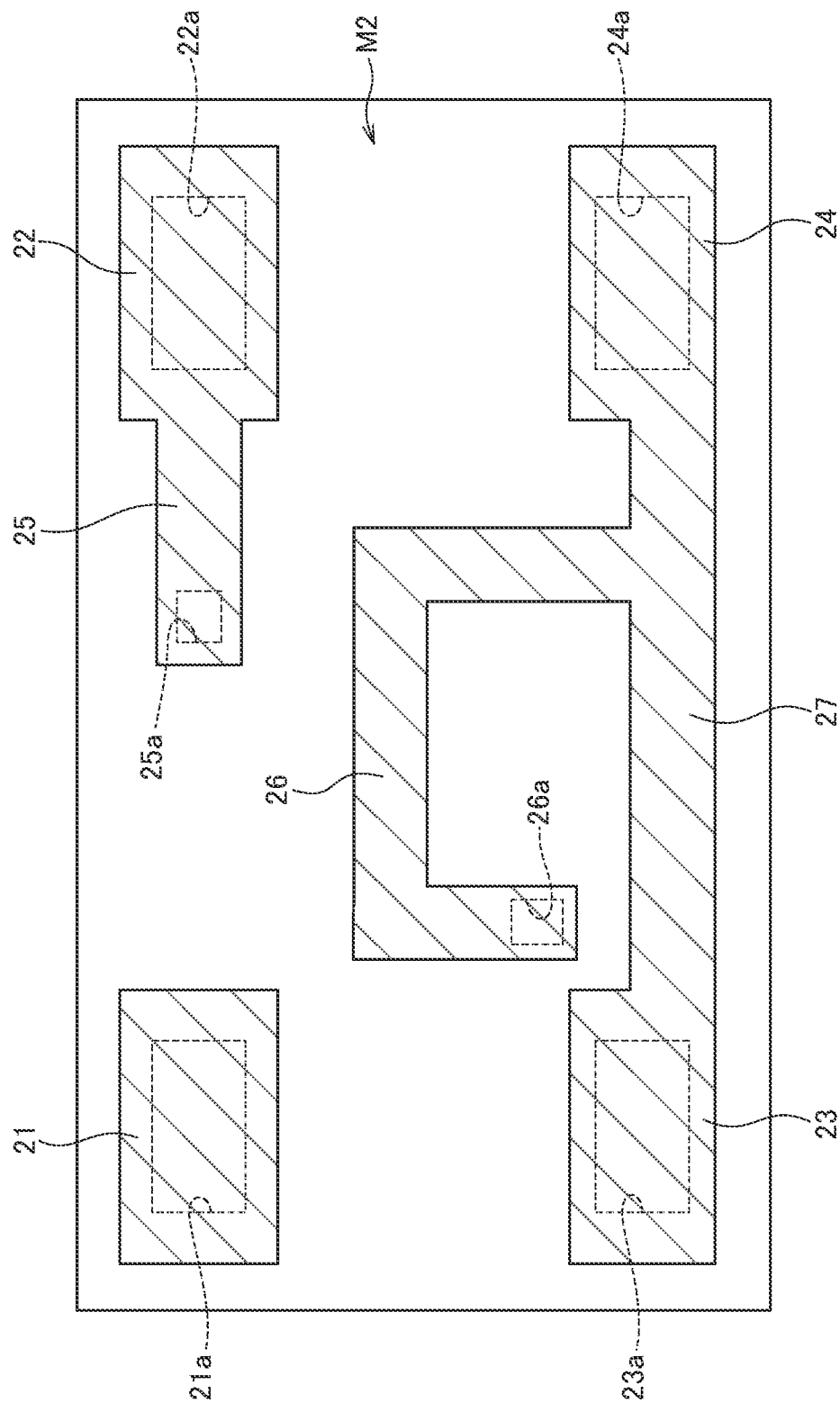
FIG. 4 is a schematic plan view for explaining the pattern shape of the conductive layer M2.

The electronic component 1 according to the present embodiment is an LC filter and includes, as illustrated in FIGS. 1 and 2, a substrate 2, conductive layers M1, MM, and M2 formed on the main surface of the substrate 2 and an insulating layer 6. The pattern shapes of the conductive layers M1 and MM are illustrated in FIG. 3, and the pattern shape of the conductive layer M2 is illustrated in FIG. 4. The material for the substrate 2 may be any material as long as it is chemically and thermally stable, generates less stress, and can maintain surface smoothness, and examples thereof include, but not particularly limited thereto, silicon single crystal, alumina, sapphire, aluminum nitride, MgO single crystal, $SrTiO_3$ single crystal, surface-oxidized silicon, glass, quartz, and ferrite. The surface of the substrate 2 is covered with a planarizing layer 3. The planarizing layer 3 may be made of, e.g., alumina or silicon oxide.

The conductive layer M1 is a conductive layer positioned in the lowermost layer and includes conductive patterns 11 to 17 as illustrated in FIG. 3. The conductive patterns 11 to 14 are each a terminal electrode pattern, the conductive pattern 15 is a capacitor lower electrode, and the conductive pattern 16 is an inductor pattern. One end of the conductive pattern 15 constituting the lower electrode and one end of the conductive pattern 16 constituting the inductor pattern are connected to the conductive pattern 11 through the conductive pattern 17. The conductive patterns 11 to 17 are each constituted of a thin seed layer S contacting the planarizing layer 3 and a plating layer P having a film thickness larger than that of the seed layer S. Similarly, the conductive patterns positioned in the conductive layers MM and M2 are each formed of a laminated body of the seed layer S and plating layer P.

Of the conductive patterns 11 to 17, at least the conductive pattern 15 constituting the capacitor lower electrode is covered at top and side surfaces 15t and 15s thereof with a dielectric film (capacitive insulating film) 4. However, the top surface 15t of the conductive pattern 15 is not entirely covered with the dielectric film 4 but partly exposed therefrom. On the other hand, the side surface 15s of the conductive pattern 15 is substantially entirely covered with the dielectric film 4 excluding the vicinity of a corner part 15c. For the conductive pattern 16, a top surface 16t is entirely exposed from the dielectric film 4, and a side surface 16s is substantially entirely covered with the dielectric film 4 excluding the vicinity of a corner part 16c.

A conductive pattern 18 is formed on the top surface of the conductive pattern 15 through the dielectric film 4. The conductive pattern 18 belongs to the conductive layer MM positioned between the conductive layers M1 and M2 and constitutes a capacitor upper electrode. Thus, there is formed a capacitor having the conductive pattern 15 as the lower electrode and the conductive pattern 18 as the upper electrode. The conductive layers M1 and MM are covered with the insulating layer 6 through a passivation film 5. The dielectric film 4 and passivation film 5 constitute a laminated film 7. In the present embodiment, the dielectric film 4 and passivation film 5 are both made of an inorganic insulating material. The inorganic insulating material constituting the dielectric film 4 and that constituting the passivation film 5 may be the same or different.

The conductive layer M2 is the second conductive layer, which is provided on the surface of the insulating layer 6 and includes conductive patterns 21 to 27, as illustrated in FIG. 4. The conductive patterns 21 to 24 are each a terminal electrode pattern, the conductive pattern 25 is a capacitor lead electrode, and the conductive pattern 26 is an inductor pattern. The conductive pattern 25 is connected to the conductive pattern 18 as the upper electrode through a via 25a formed in the insulating layer 6 and to the conductive pattern 22. One end of the conductive pattern 26 constituting the inductor pattern is connected to the other end of the conductive pattern 16 through a via 26a formed in the insulating layer 6, and the other end thereof is connected to the conductive patterns 23 and 24 through the conductive pattern 27. The conductive patterns 21 to 24 are connected respectively to the conductive patterns 11 to 14 through respective vias 21a to 24a formed in the insulating layer 6.

Figure 5:
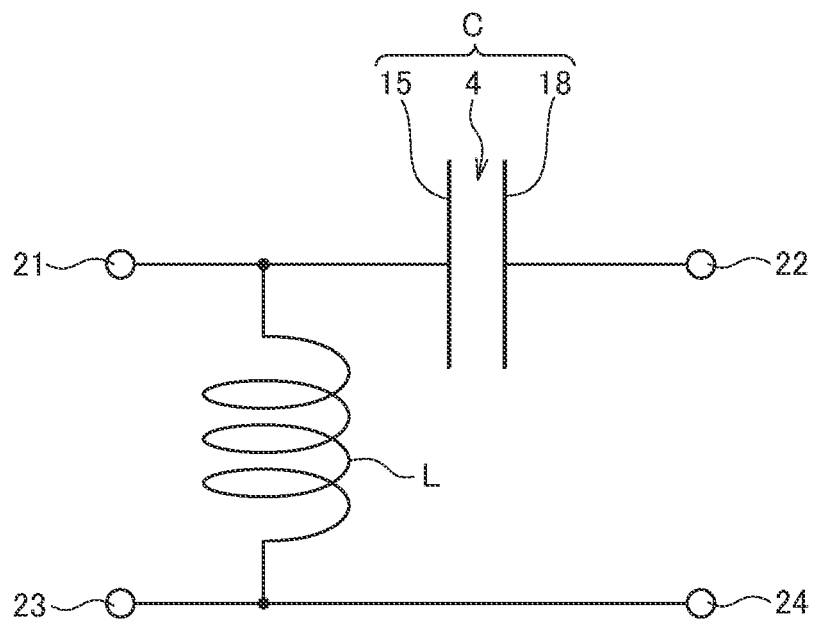
FIG. 5 is an equivalent circuit diagram of the electronic component 1.

FIG. 5 is an equivalent circuit diagram of the electronic component 1 according to the present embodiment.

As illustrated in FIG. 5, the electronic component 1 according to the present embodiment has a circuit configuration in which a capacitor C is connected between the conductive patterns 21 and 22, and an inductor L is connected between the conductive pattern 21 and the conductive patterns 23 and 24. The capacitor C is constituted by the conductive pattern 15 as the lower electrode, the conductive pattern 18 as the upper electrode, and the dielectric film 4 positioned between the conductive patterns 15 and 18.

Figure 6:
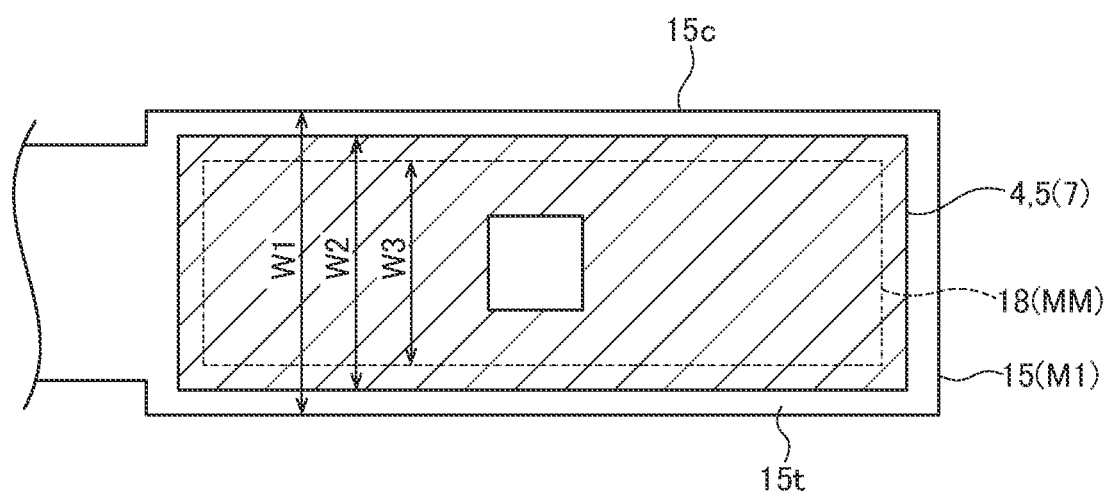
FIG. 6 is an enlarged plan view of the capacitor C.

FIG. 6 is an enlarged plan view of the capacitor C.

As illustrated in FIG. 6, assuming that, in a plan view, the width of the conductive pattern 15 as the lower electrode is W1, the widths of the dielectric film 4 and passivation film 5 are each W2, and the width of the conductive pattern 18 as the upper electrode is W3, W1>W2>W3 is satisfied in the present embodiment. Accordingly, a part of the top surface 15t of the conductive pattern 15 that overlaps the conductive pattern 18 is covered with the dielectric film 4, whereas a part thereof that does not overlap the conductive pattern 18 is partly not covered with the laminated film 7 of the dielectric film 4 and passivation film 5, i.e., partly exposed. In particular, in the example illustrated in FIG. 6, the entire corner part 15c, which is the terminal edge between the top and side surfaces 15t and 15s of the conductive pattern 15 is not covered with the laminated film 7 of the dielectric film 4 and passivation film 5 but exposed.

Thus, stress is relaxed due to removal of the laminated film 7, making peeling at the interface between the conductive pattern 15 and the dielectric film 4 less likely to occur. In particular, stress concentrates on a part of the laminated film 7 that covers the corner part 15c of the conductive pattern 15, so that peeling is likely to occur starting from this part; however, in the example illustrated in FIG. 6, the entire corner part 15c of the conductive pattern 15 is exposed, thereby preventing peeling starting from the corer part.

Further, as illustrated in FIG. 2, the laminated film 7 is also removed from a part parallel to the main surface of the substrate 2, i.e., the surface of the planarizing layer 3 and the top surface 16t of the conductive pattern 16 constituting the inductor pattern, whereby deterioration in reliability due to peeling of the dielectric film 4 is prevented. On the other hand, a part perpendicular to the main surface of the substrate 2, i.e., the side surfaces of the conductive patterns 11 to 17 constituting the conductive layer M1 are covered with the laminated film 7 and are thus protected thereby.

However, the removal position of the laminated film 7 of the dielectric film 4 and passivation film 5 is not limited to this. The following describes some modifications.

Figure 7A:
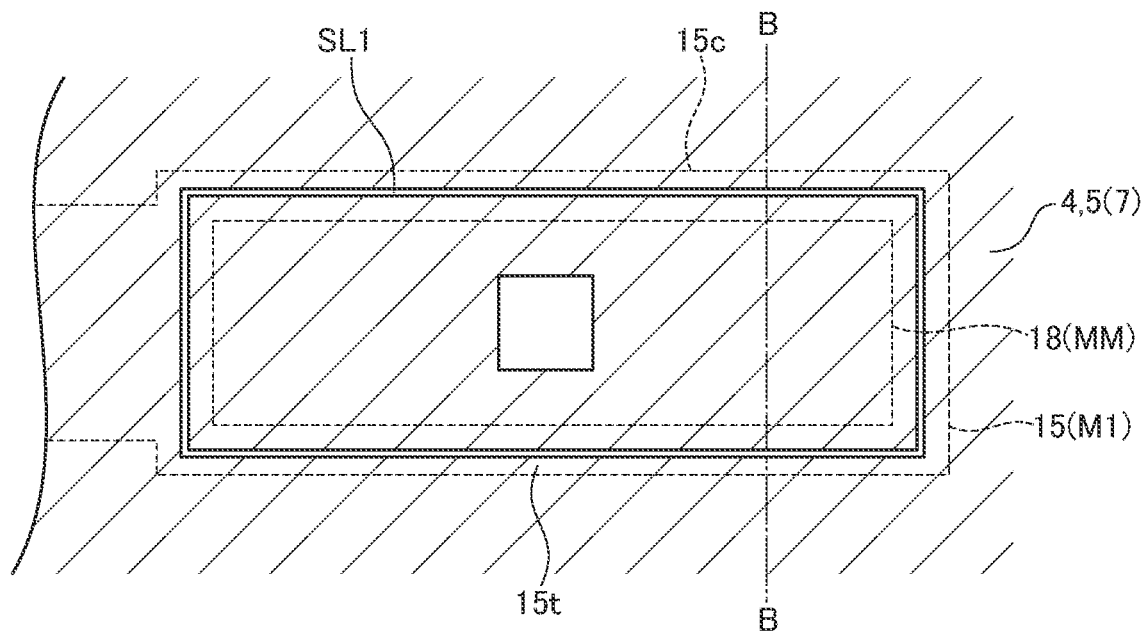
FIG. 7A is an enlarged plan view of the capacitor C according to a first modification.
Figure 7B:
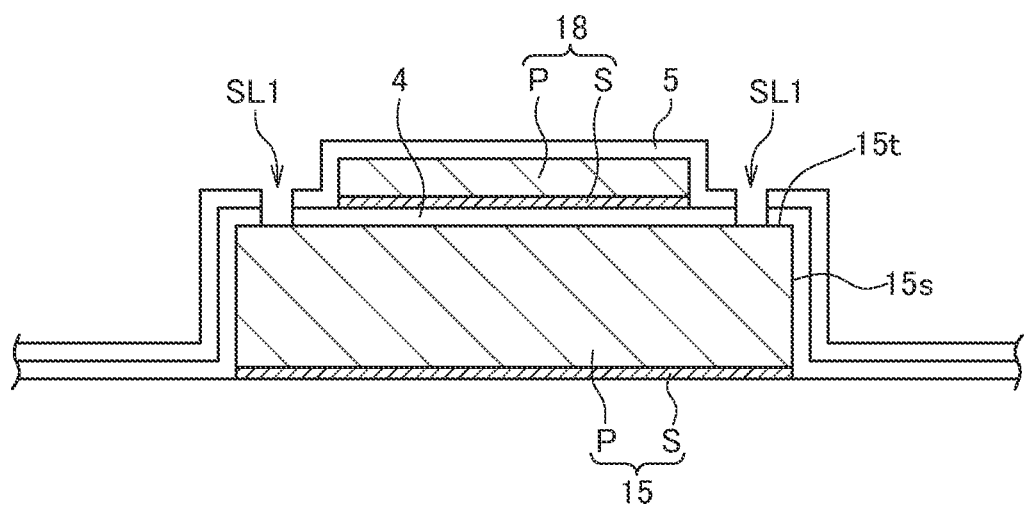
FIG. 7B is a schematic cross-sectional view taken along the line B-B.

FIG. 7A is an enlarged plan view of the capacitor C according to a first modification, and FIG. 7B is a schematic cross-sectional view taken along the line B-B.

In the example illustrated in FIGS. 7A and 7B, a slit SL1 is formed at a part of the laminated film 7 of the dielectric film 4 and passivation film 5 that covers the top surface 15t of the conductive pattern 15, through which the top surface 15t of the conductive pattern 15 is exposed from the laminated film 7. The slit SL1 is formed annually so as to surround the conductive pattern 18 as the upper electrode in a plan view. With such a configuration, stress can be relaxed due to the presence of the slit SL1. In particular, the slit SL1 is formed in the vicinity of the conductive pattern 18 as the upper electrode, so that even when peeling occurs at, for example, a part that covers the corner part 15c of the conductive pattern 15, it does not propagate to a part functioning as the capacitor C. Further, a large part of the conductive layer M1 is covered with the laminated film 7 of the dielectric film 4 and passivation film 5, so that the conductive layer M1 is protected more reliably.

Figure 8A:
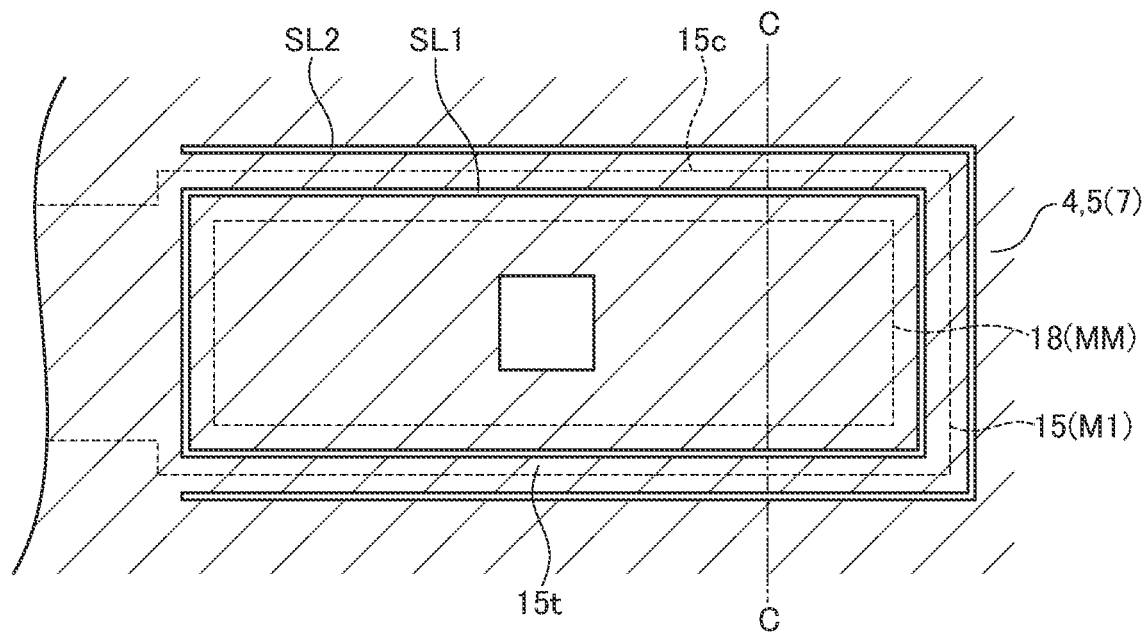
FIG. 8A is an enlarged plan view of the capacitor C according to a second modification.
Figure 8B:
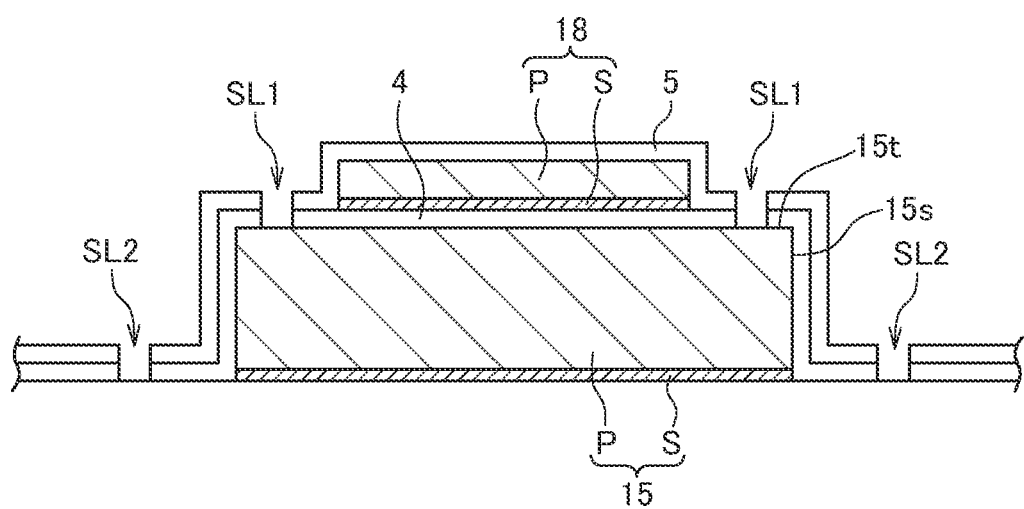
FIG. 8B is a schematic cross-sectional view taken along the line C-C.

FIG. 8A is an enlarged plan view of the capacitor C according to a second modification, and FIG. 8B is a schematic cross-sectional view taken along the line C-C.

The example illustrated in FIGS. 8A and 8B differs from the first modification illustrated in FIG. 7 in that a slit SL2 is formed at a part of the laminated film 7 of the dielectric film 4 and passivation film 5 that surrounds the conductive pattern 15, i.e., a part thereof that is formed on the main surface of the substrate 2 through the planarizing layer 3. The presence of the thus formed slit SL2 allows relaxation of stress occurring in the large-area laminated film 7 formed on the substrate 2.

Figure 9:
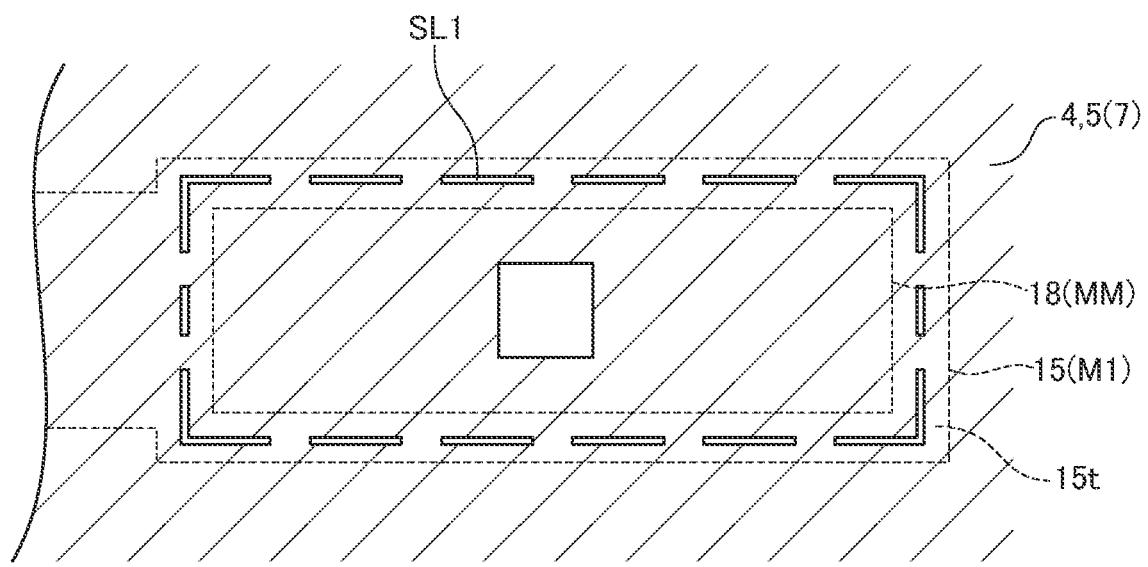
FIG. 9 is an enlarged plan view of the capacitor C according to a third modification.

FIG. 9 is an enlarged plan view of the capacitor C according to a third modification.

The example illustrated in FIG. 9 differs from the first medication illustrated in FIG. 7 in that the slit SL1 is discontinuously formed. As exemplified by the third modification, the slit SL1 need not necessarily be continuous and may be discontinuous.

The following describes a manufacturing method for the electronic component 1 according to the present embodiment.

FIGS. 10 to 22 are process views for explaining the manufacturing method for the electronic component 1 according to the present embodiment. Although many pieces of the electronic components 1 are obtained from an aggregate substrate in the manufacturing process of the electronic component 1, the following explanation will be given focusing on the manufacturing process of one electrode component 1.

Figure 10:
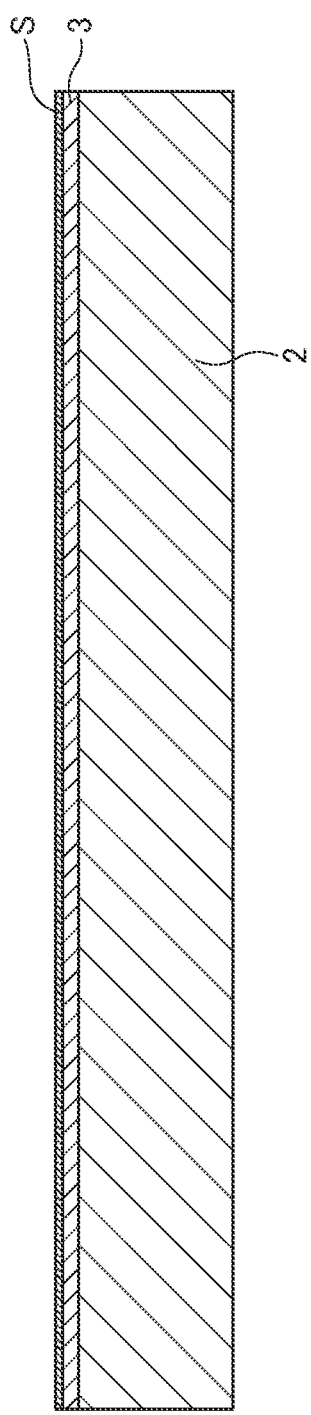
FIG. 10 is a process view for explaining the manufacturing method for the electronic component 1.
Figure 11:
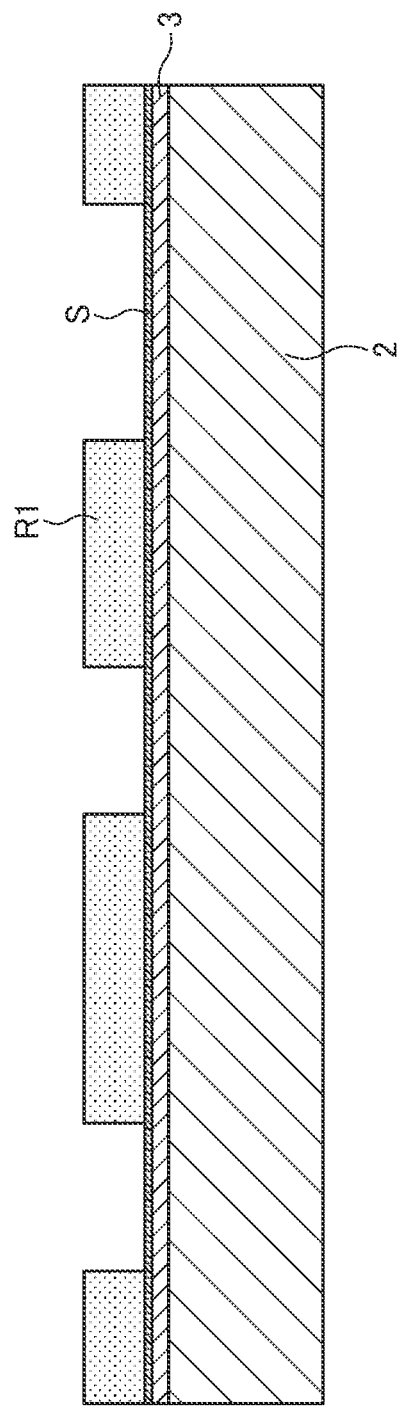
FIG. 11 is a process view for explaining the manufacturing method for the electronic component 1.
Figure 12:
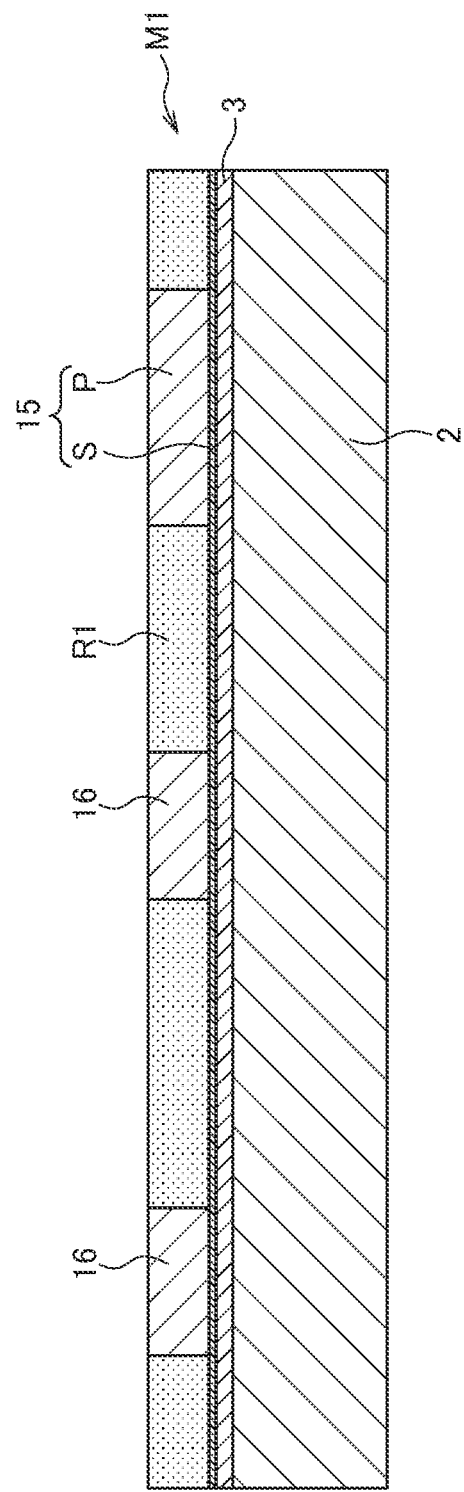
FIG. 12 is a process view for explaining the manufacturing method for the electronic component 1.

As illustrated in FIG. 10, the planarizing layer 3 is formed by sputtering or the like on the substrate (aggregate substrate) 2, and the surface of the planarizing layer 3 is subjected to grinding or mirror finishing such as CMP for planarization. Thereafter, the seed layer S is formed by sputtering or the like on the surface of the planarizing layer 3. Subsequently, as illustrated in FIG. 11, a resist layer R1 is spin-coated on the seed layer S and then patterned so as to expose a part of the seed layer S on which the conductive layer M1 is to be formed. In this state, electrolyte plating is performed using the seed layer S as a feed to form a plating layer P on the seed layer S as illustrated in FIG. 12. A laminated body of the seed layer S and plating layer P constitutes the conductive layer M1. In the cross section illustrated in FIG. 12, the conductive layer M1 includes the conductive patterns 11 and 16.

Figure 13:
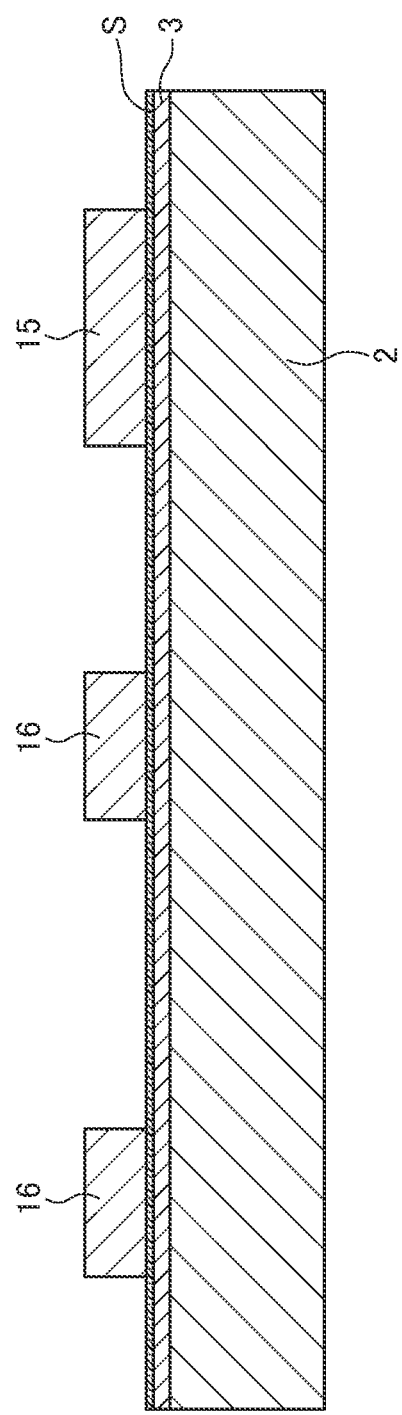
FIG. 13 is a process view for explaining the manufacturing method for the electronic component 1.
Figure 14:
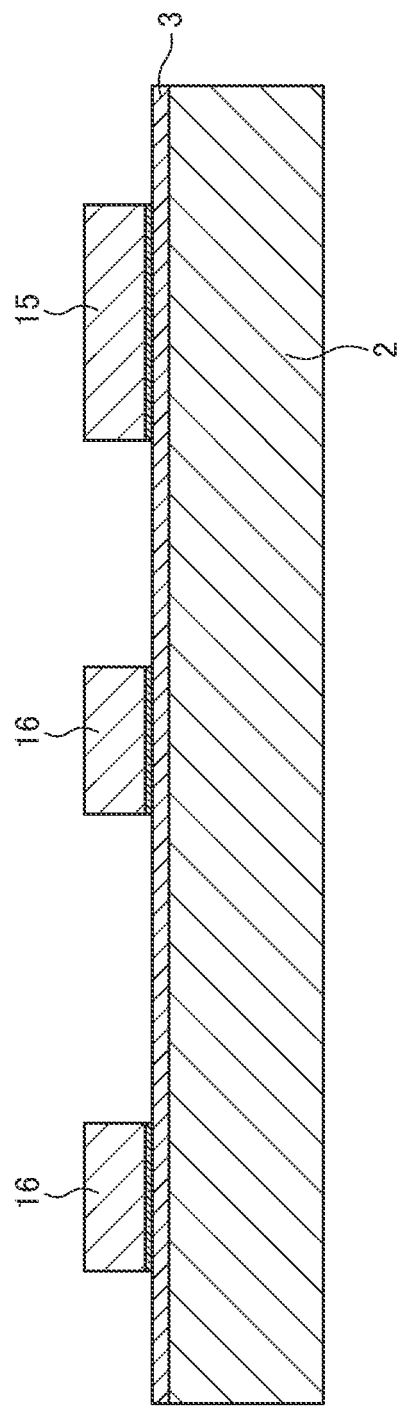
FIG. 14 is a process view for explaining the manufacturing method for the electronic component 1.
Figure 15:
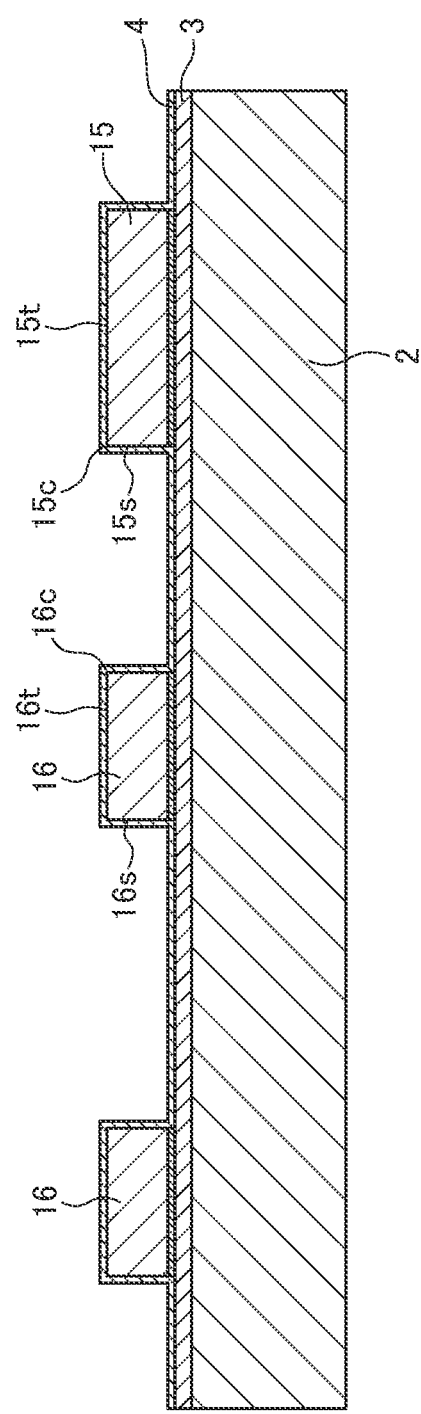
FIG. 15 is a process view for explaining the manufacturing method for the electronic component 1.

Then, after removal of the resist layer R1 as illustrated in FIG. 13, wet etching is performed using an acid to remove the seed layer S covered with the resist layer R1 as illustrated in FIG. 14. Then, as illustrated in FIG. 15, the dielectric film 4 is formed on the entire surface of the conductive layer M1 including the top and side surfaces thereof. The dielectric film 4 may be formed of a paraelectric material such as silicon nitride (SiNx) or silicon oxide (SiOx) and other known ferroelectric material. The dielectric film 4 can be formed by sputtering, plasma CVD, MOCVD, sol-gel, electron beam vapor deposition, or the like. As a result, the top surface 15t, side surface 15s, and corner part 15c of the conductive pattern 15 are all completely covered with the dielectric film 4. Similarly, the top surface 16t, side surface 16s, and corner part 16c of the conductive pattern 16 are also all completely covered with the dielectric film 4.

Figure 16:
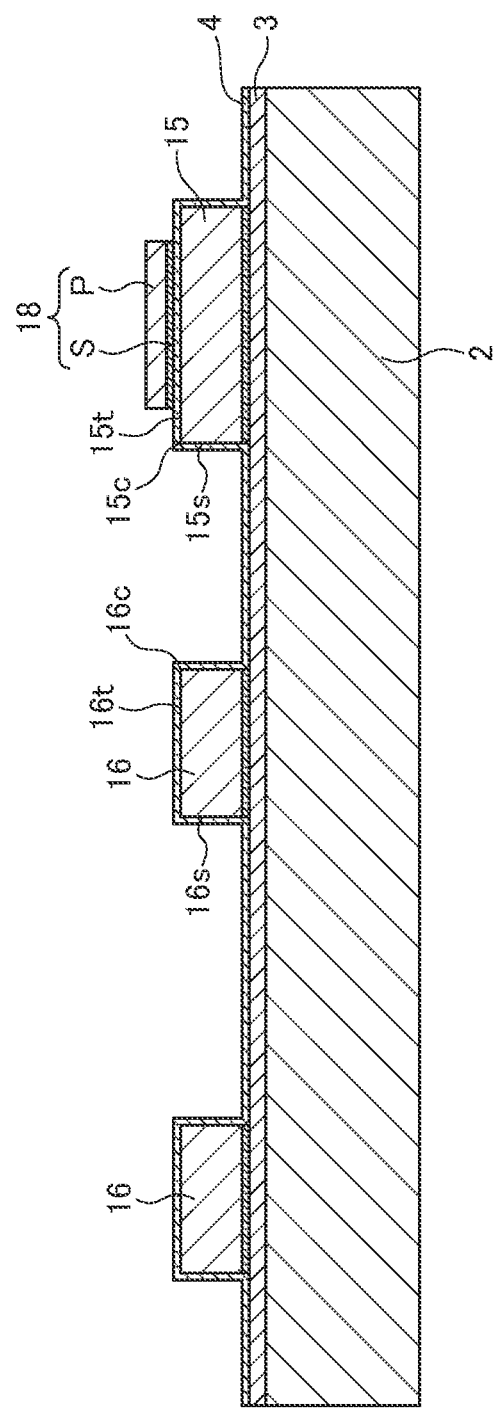
FIG. 16 is a process view for explaining the manufacturing method for the electronic component 1.

Then, as illustrated in FIG. 16, the same method as that for the conductive layer M1 is used to form the conductive pattern 18 on the top surface of the conductive pattern 15 through the dielectric film 4. The conductive pattern 18 is also formed of a laminated body of the seed layer S and plating layer P. This completes the conductive layer MM to thereby form a capacitor having the conductive pattern 15 as the lower electrode and the conductive pattern 18 as the upper electrode. Although not particularly limited, it is preferable to make the film thickness of the conductive layer MM smaller than that of the conductive layer M1. This increases processing accuracy of the conductive layer MM to reduce a variation in capacitance due to the processing accuracy.

Figure 17:
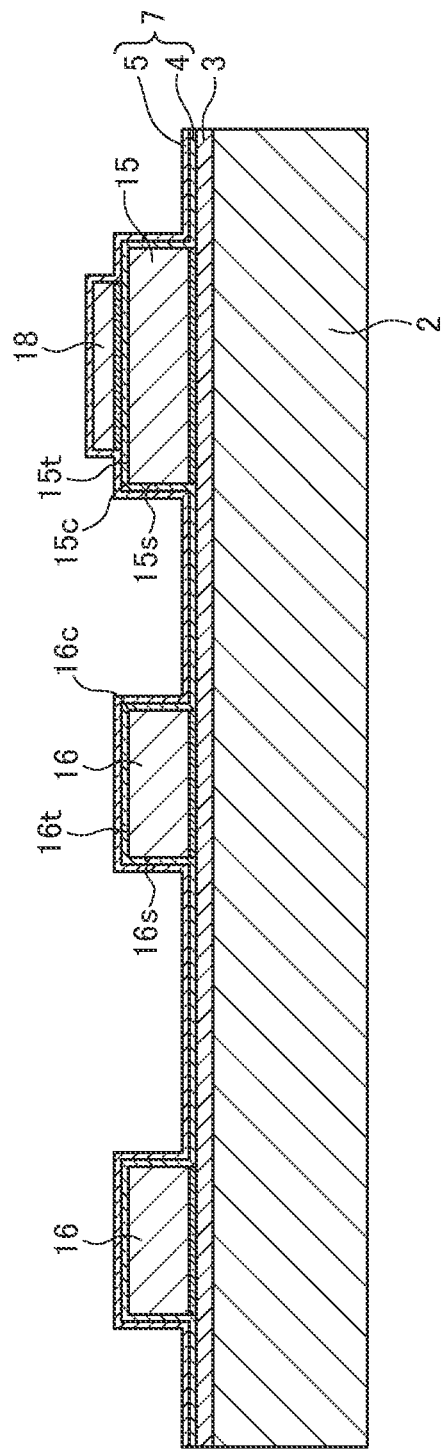
FIG. 17 is a process view for explaining the manufacturing method for the electronic component 1.
Figure 18:
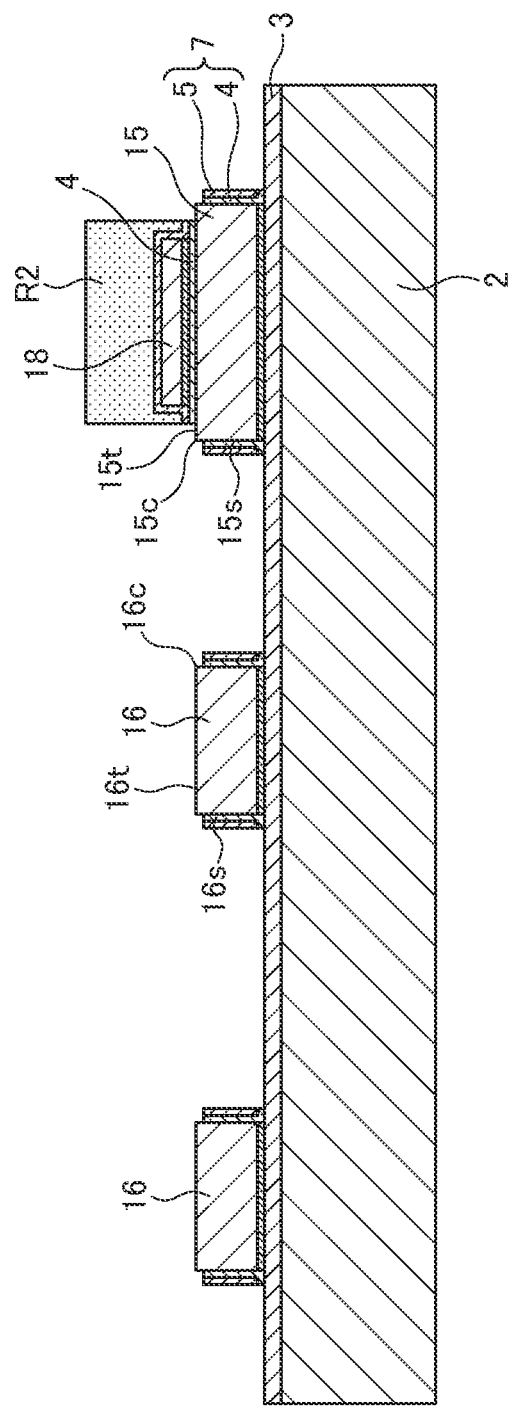
FIG. 18 is a process view for explaining the manufacturing method for the electronic component 1.

Then, as illustrated in FIG. 17, the passivation film 5 that covers the conductive layers M1 and MM is formed over the entire exposed surface. As a result, the conductive pattern 18 as the upper electrode is directly covered with the passivation film 5, and a region where the conductive pattern 18 is absent is covered with the laminated film 7 of the dielectric film 4 and passivation film 5. Then, as illustrated in FIG. 18, a resist layer R2 that covers the conductive pattern 18 is formed, and the laminated film 7 is etched in this state. At this time, a part of the top surface 15t of the conductive pattern 15 that is not covered with the conductive pattern 18 is partly exposed from the resist layer R2, whereby the laminated film 7 that covers the top surface 15t of the conductive pattern 15 is partly removed, with the result that the top surface 15t of the conductive pattern 15 is exposed at this part. Further, the corner part 15c of the conductive pattern 15 is also made to be exposed from the resist layer R2 and is thereby exposed in the same manner as the top surface 15t. On the other hand, a large part of the side surface 15s of the conductive pattern 15 is kept being covered with the laminated film 7 excluding the vicinity of the corner part 15c. For the conductive pattern 16 constituting the inductor pattern as well, the laminated film 7 covering the top surface 16t and corner part 16c is removed, while the side surface 16s is kept being covered with the laminated film 7. Further, the surface of the planarizing layer 3 on which the conductive layer M1 is not formed is subjected to the removal of the laminated film 7.

Figure 19:
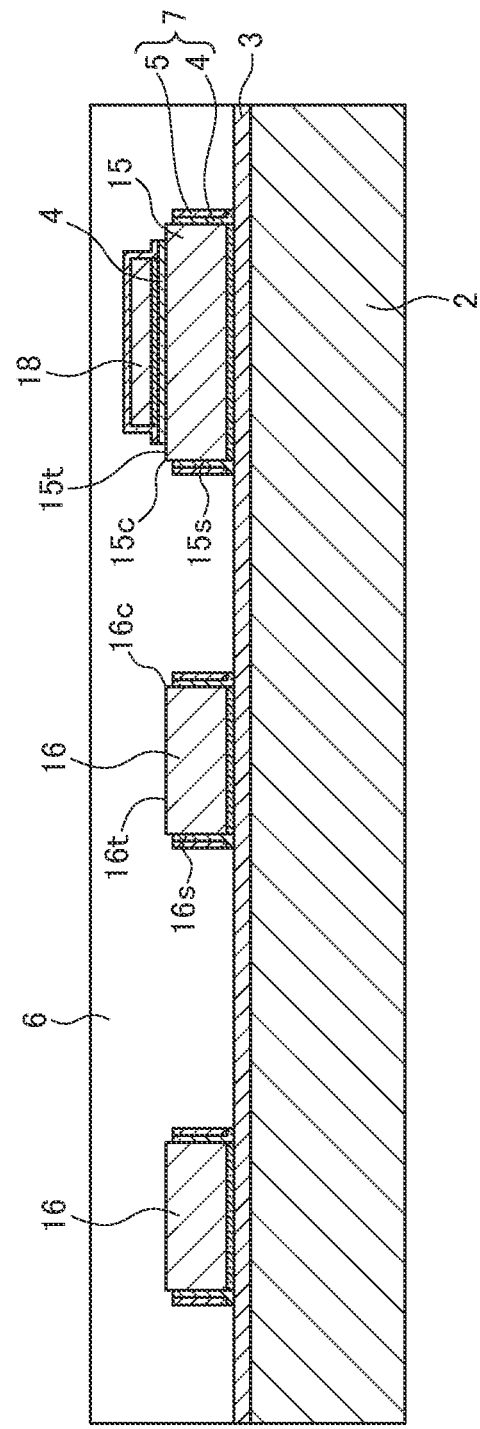
FIG. 19 is a process view for explaining the manufacturing method for the electronic component 1.
Figure 20:
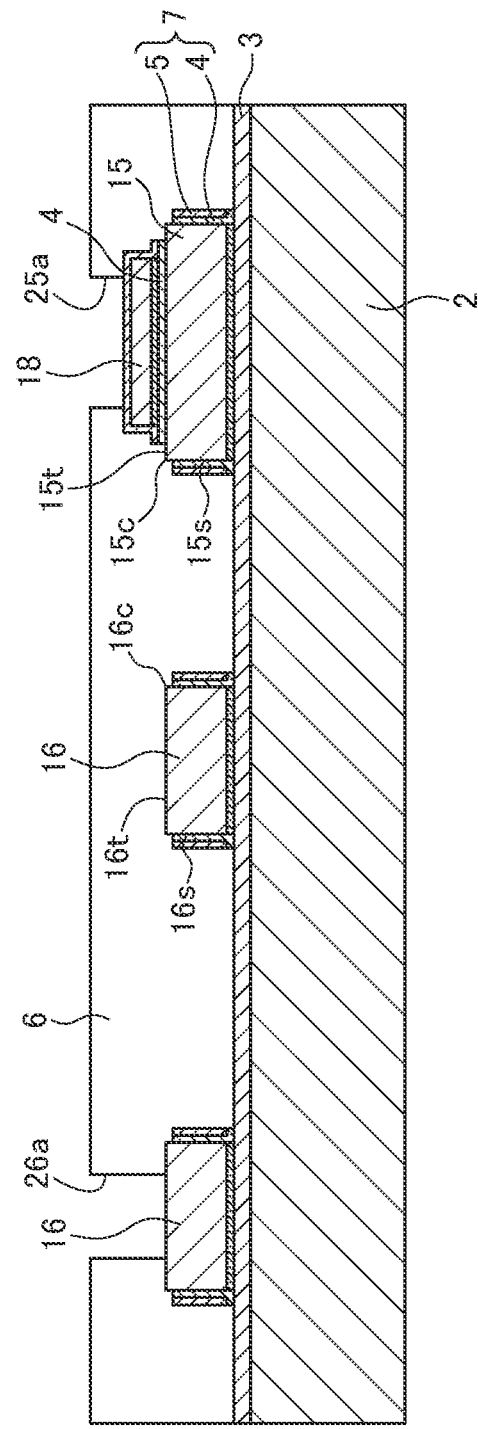
FIG. 20 is a process view for explaining the manufacturing method for the electronic component 1.

Then, after the removal of the resist layer R2, the insulating layer 6 is formed over the entire exposed surface as illustrated in FIG. 19. Subsequently, the insulating layer 6 is patterned to form the vias 25a and 26a in the insulating layer 6, as illustrated in FIG. 20. The passivation film 5 that covers the conductive pattern 18 is exposed to the bottom of the via 25a, and the conductive pattern 16 is exposed to the bottom of the via 26a.

Figure 21:
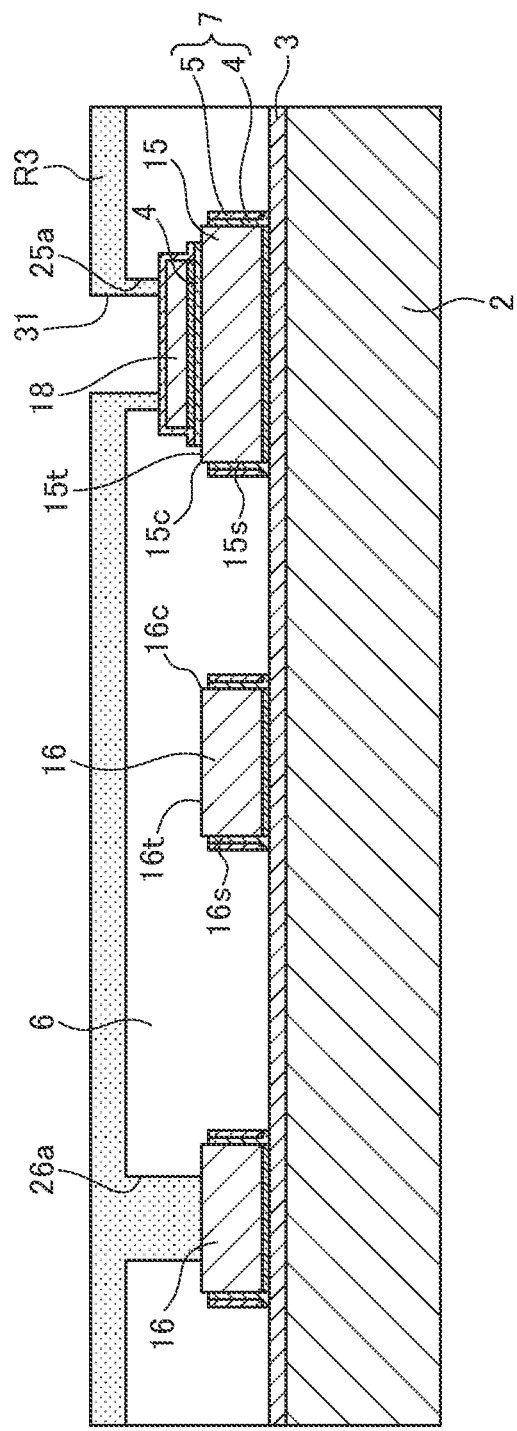
FIG. 21 is a process view for explaining the manufacturing method for the electronic component 1.
Figure 22:
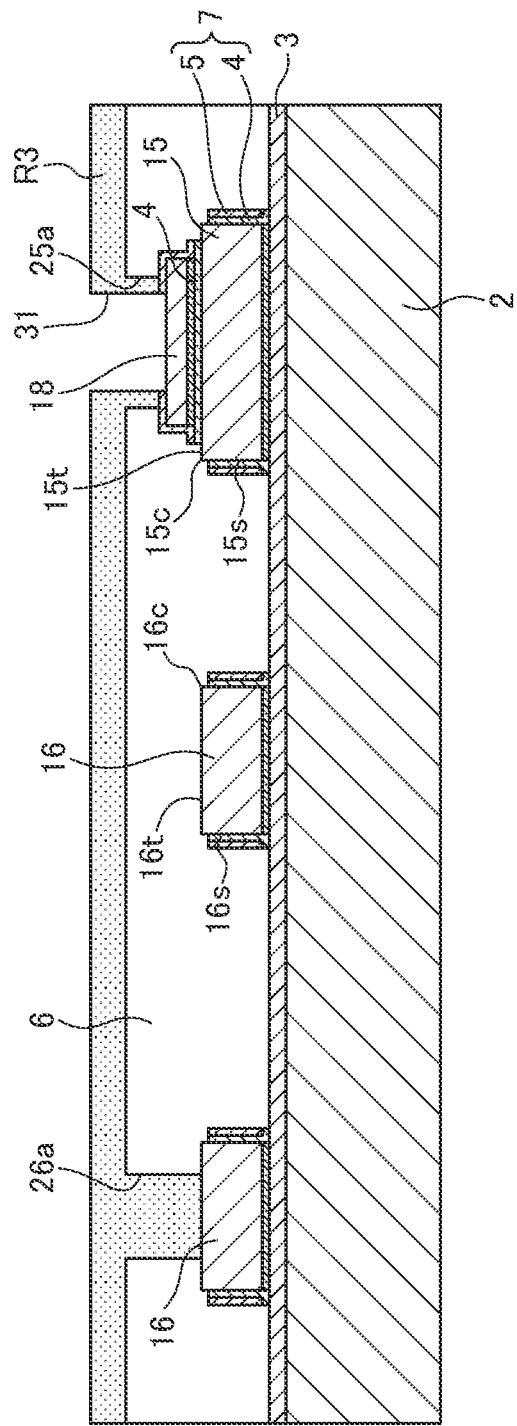
FIG. 22 is a process view for explaining the manufacturing method for the electronic component 1.

Then, as illustrated in FIG. 21, a resist layer R3 is formed on the insulating layer 6, and an opening 31 that overlaps the via 25a is formed in the resist layer R3. As a result, the passivation film 5 that covers the top surface of the conductive pattern 18 is exposed through the opening 31. In this state, ion milling or the like is applied to remove the passivation film 5 exposed to the opening 31 to expose the top surface of the conductive pattern 18, as illustrated in FIG. 22.

Then, the resist layer R3 is removed, and then the conductive layer M2 is formed on the insulating layer 6 using the same method as the formation method for the conductive layer M1, whereby the electronic component 1 having the cross-section illustrated in FIG. 2 is completed.

As described above, in the electronic component 1 according to the present embodiment, a part of the laminated film 7 of the dielectric film 4 and passivation film 5 that is parallel to the main surface of the substrate 2 is removed at least partly, so that the stress of the laminated film 7 is relaxed. This can prevent peeling at the interface between the conductive layer M1 and the dielectric film 4, particularly, at the interface between the conductive pattern 15 as the lower electrode and the dielectric film 4.

While the preferred embodiment of the present invention has been described, the present invention is not limited to the above embodiment, and various modifications may be made within the scope of the present invention, and all such modifications are included in the present invention.

For example, while the present invention is applied to an LC filter in the above embodiment, the electronic component as the subject matter of the present invention is not limited to the LC filter, but may be electronic components of other types.

REFERENCE SIGNS LIST 1 electronic component
2 substrate
3 planarizing layer
4 dielectric film
5 passivation film
6 insulating layer
7 laminated film
11-18, 21-27 conductive pattern
21a-26a via
15c, 16c corner part
15s, 16s side surface
15t, 16t top surface
31 opening
C capacitor
L inductor
M1, MM, M2 conductive layer
P plating layer
R1-R3 resist layer
S seed layer
SL1, SL2 slit

What is claimed is:
1. An electronic component comprising:
a lower electrode provided on a main surface of a substrate;
a dielectric film that covers at least top and side surfaces of the lower electrode; and
an upper electrode stacked on the top surface of the lower electrode through the dielectric film, wherein a part of the dielectric film that is parallel to the main surface of the substrate is removed at least partly, and wherein a part of the dielectric film that covers a corner part that is a terminal edge between the top and side surfaces of the lower electrode is removed at least partly.

2. The electronic component as claimed in claim 1,
wherein the dielectric film includes a first part that covers the top surface of the lower electrode not through the upper electrode, and
wherein the first part is removed at least partly.

3. The electronic component as claimed in claim 1,
wherein the dielectric film includes a second part that covers the main surface of the substrate not through the lower electrode, and
wherein the second part is removed at least partly.

4. The electronic component as claimed in claim 1, further comprising a passivation film that covers the upper electrode in a region where the upper electrode is present and covers the dielectric film in a region where the upper electrode is absent,
wherein a part of a laminated film of the dielectric film and passivation film that is parallel to the main surface of the substrate is removed at least partly.

5. The electronic component as claimed in claim 4, wherein the dielectric film and the passivation film are both made of an inorganic insulating material.

6. The electronic component as claimed in claim 1, further comprising an inductor pattern positioned in a same conductive layer as the lower electrode,
wherein a part of the dielectric film positioned on a top surface of the inductor pattern is removed at least partly.

7. An electronic component comprising:
a lower electrode provided on a main surface of a substrate;
a dielectric film that covers at least top and side surfaces of the lower electrode;
an upper electrode stacked on the top surface of the lower electrode through the dielectric film; and
a passivation film that covers the upper electrode in a region where the upper electrode is present and covers the dielectric film in a region where the upper electrode is absent,
wherein a part of a laminated film of the dielectric film and passivation film that is parallel to the main surface of the substrate is removed at least partly.

8. The electronic component as claimed in claim 7,
wherein the dielectric film includes a first part that covers the top surface of the lower electrode not through the upper electrode, and
wherein the first part is removed at least partly.

9. The electronic component as claimed in claim 7,
wherein the dielectric film includes a second part that covers the main surface of the substrate not through the lower electrode, and
wherein the second part is removed at least partly.

10. The electronic component as claimed in claim 7, wherein the dielectric film and the passivation film are both made of an inorganic insulating material.

11. The electronic component as claimed in claim 7, further comprising an inductor pattern positioned in a same conductive layer as the lower electrode,
wherein a part of the dielectric film positioned on a top surface of the inductor pattern is removed at least partly.

* * * * *